US009887373B2

(12) United States Patent
Lee et al.

(10) Patent No.: US 9,887,373 B2
(45) Date of Patent: Feb. 6, 2018

(54) THIN FILM TRANSISTOR, METHOD OF MANUFACTURING THE SAME, AND ELECTRONIC DEVICE INCLUDING THE THIN FILM TRANSISTOR

(71) Applicant: Samsung Electronics Co., Ltd., Suwon-Si, Gyeonggi-Do (KR)

(72) Inventors: Ji Youl Lee, Seoul (KR); Joo Young Kim, Hwaseong-si (KR); Jong Won Chung, Hwaseong-si (KR); Sang Yoon Lee, Seoul (KR); Jeong Il Park, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/479,845

(22) Filed: Sep. 8, 2014

(65) Prior Publication Data

US 2015/0123100 A1 May 7, 2015

(30) Foreign Application Priority Data

Nov. 6, 2013 (KR) ........................ 10-2013-0134389
Jun. 23, 2014 (KR) ........................ 10-2014-0076624

(51) Int. Cl.
*H01L 51/05* (2006.01)
*H01L 51/00* (2006.01)

(52) U.S. Cl.
CPC ...... *H01L 51/0545* (2013.01); *H01L 51/0007* (2013.01); *H01L 51/0018* (2013.01); *H01L 51/0558* (2013.01); *H01L 51/0017* (2013.01); *H01L 51/0074* (2013.01)

(58) Field of Classification Search
CPC .................................................. H01L 51/0545
See application file for complete search history.

(56) References Cited

U.S. PATENT DOCUMENTS 7,086,917 B2 8/2006 Tao
7,202,179 B2 4/2007 Taussig et al.
7,439,103 B2 10/2008 Seo et al.
7,674,701 B2 3/2010 Rinne
8,754,478 B2 6/2014 Ushikura
(Continued)

FOREIGN PATENT DOCUMENTS

JP 2011254091 A 12/2011
JP 2013084845 A 5/2013
(Continued)

OTHER PUBLICATIONS

Extended European Search Report dated May 29, 2015, in European Application No. 14188193.8.
(Continued)

*Primary Examiner* — Alexander Ghyka
(74) *Attorney, Agent, or Firm* — Harness, Dickey & Pierce, P.L.C.

(57) ABSTRACT

A thin film transistor includes a gate electrode and an organic semiconductor overlapping the gate electrode. A gate insulating layer is disposed between the gate electrode and the organic semiconductor. A source electrode and a drain electrode are disposed on and electrically connected to the organic semiconductor. A solvent selective photosensitive pattern is disposed on the organic semiconductor and between the source electrode and the drain electrode. An electronic device may include the thin film transistor.

16 Claims, 11 Drawing Sheets

(56) References Cited

U.S. PATENT DOCUMENTS

| | | | |
|---|---|---|---|
| 2005/0142496 | A1 | 6/2005 | Kang et al. |
| 2007/0031990 | A1 | 2/2007 | Maekawa |
| 2010/0003621 | A1 | 1/2010 | Yin et al. |
| 2010/0197075 | A1 | 8/2010 | Maekawa |
| 2012/0211737 | A1 | 8/2012 | Maekawa |

FOREIGN PATENT DOCUMENTS

| | | | |
|---|---|---|---|
| KR | 100272255 | B1 | 11/2000 |
| KR | 100652055 | B1 | 12/2006 |
| WO | WO-2006/025473 | A1 | 3/2006 |
| WO | WO-2012/118713 | A2 | 9/2012 |

OTHER PUBLICATIONS

International Search Report dated Sep. 27, 2012, in International Application No. PCT/US2012/026565.

THIN FILM TRANSISTOR, METHOD OF MANUFACTURING THE SAME, AND ELECTRONIC DEVICE INCLUDING THE THIN FILM TRANSISTOR

CROSS-REFERENCE TO RELATED APPLICATION

This application claims priority under 35 U.S.C. §119 to Korean Patent Application No. 10-2013-0134389, filed in the Korean Intellectual Property Office on Nov. 6, 2013, and Korean Patent Application No. 10-2014-0076624, filed in the Korean Intellectual Property Office on Jun. 23, 2014, the entire contents of which are incorporated herein by reference.

BACKGROUND

1. Field

The present disclosure relates to a thin film transistor, a method of manufacturing the same, and an electronic device including the thin film transistor.

2. Description of the Related Art

A flat panel display, such as a liquid crystal display (LCD), an organic light emitting diode (OLED) display, an electrophoretic display, and the like, includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pair of the electric field-generating electrodes is commonly connected to a switching device and receives an electrical signal, and the electrical optical active layer transforms the electrical signal into an optical signal and thus displays an image.

The flat panel display includes a thin film transistor (TFT) that is a three-terminal element as a switching element.

Research has been conducted on an organic thin film transistor (OTFT) including an organic semiconductor such as a low molecular weight semiconductor or polymer semiconductor instead of an inorganic semiconductor such as a silicon (Si) semiconductor as one kind of the thin film transistor.

The organic thin film transistor may be made into a fiber or a film due to characteristics of an organic material, and thus is drawing attention as an important element for a flexible display device.

However, an organic semiconductor used in the organic thin film transistor may be easily damaged in subsequent processes due to the characteristics of the organic material, and has a limit for forming a fine structured thin film transistor capable of realizing a relatively short channel length.

SUMMARY

Some example embodiments relate to a thin film transistor that may reduce organic semiconductor damage and simultaneously provide a relatively short channel length, thus improving the performance thereof.

Some example embodiments relate to a method of manufacturing the thin film transistor.

Some example embodiments relate to an electronic device including the thin film transistor.

According to one example embodiment, a thin film transistor may include a gate electrode, an organic semiconductor overlapping the gate electrode, a gate insulating layer disposed between the gate electrode and the organic semiconductor, a source electrode and a drain electrode disposed on and electrically connected to the organic semiconductor, and a solvent selective photosensitive pattern disposed on the organic semiconductor and between the source electrode and the drain electrode.

The solvent selective photosensitive pattern may be formed of a composition substantially not causing a chemical interaction with the organic semiconductor.

The composition may include a fluorine compound (including a fluorine-containing low molecular compound, a fluorine-containing oligomer, a fluorine-containing polymer, or a combination thereof), a photosensitive material, and a fluorine-containing solvent.

The solvent selective photosensitive pattern may have a smaller width than the organic semiconductor.

A width of the solvent selective photosensitive pattern and a channel length of the thin film transistor may substantially be the same.

The channel length of the thin film transistor may be less than or equal to about 10 μm.

The channel length of the thin film transistor may be less than or equal to about 5 μm.

The organic semiconductor may be a deposited organic semiconductor.

According to another example embodiment, a method of manufacturing a thin film transistor may include providing a gate electrode; providing a gate insulating layer on the gate electrode; providing an organic semiconductor on the gate insulating layer; providing a solvent selective photosensitive pattern on the organic semiconductor; and providing a source electrode and a drain electrode on the organic semiconductor and the solvent selective photosensitive pattern. The source electrode and the drain electrode are electrically connected to the organic semiconductor.

The providing of the organic semiconductor may include providing an organic semiconductor thin film on the gate insulating layer, and etching the organic semiconductor thin film by using a mask pattern including the same material as in the solvent selective photosensitive pattern.

The providing of the organic semiconductor thin film may be performed through solution coating or deposition, and the etching of the organic semiconductor thin film may be performed through dry etching.

The providing of the solvent selective photosensitive pattern may include coating a composition substantially not causing a chemical reaction with the organic semiconductor.

The composition may include a fluorine compound (including a fluorine-containing low molecular compound, a fluorine-containing oligomer, a fluorine-containing polymer, or a combination thereof), a photosensitive material, and a fluorine-containing solvent.

According to another example embodiment, an electronic device may include the thin film transistor.

The electronic device may include a liquid crystal display (LCD), an organic light emitting diode (OLED), an electrophoretic display device, or an organic sensor.

DETAILED DESCRIPTION

Figure 1:
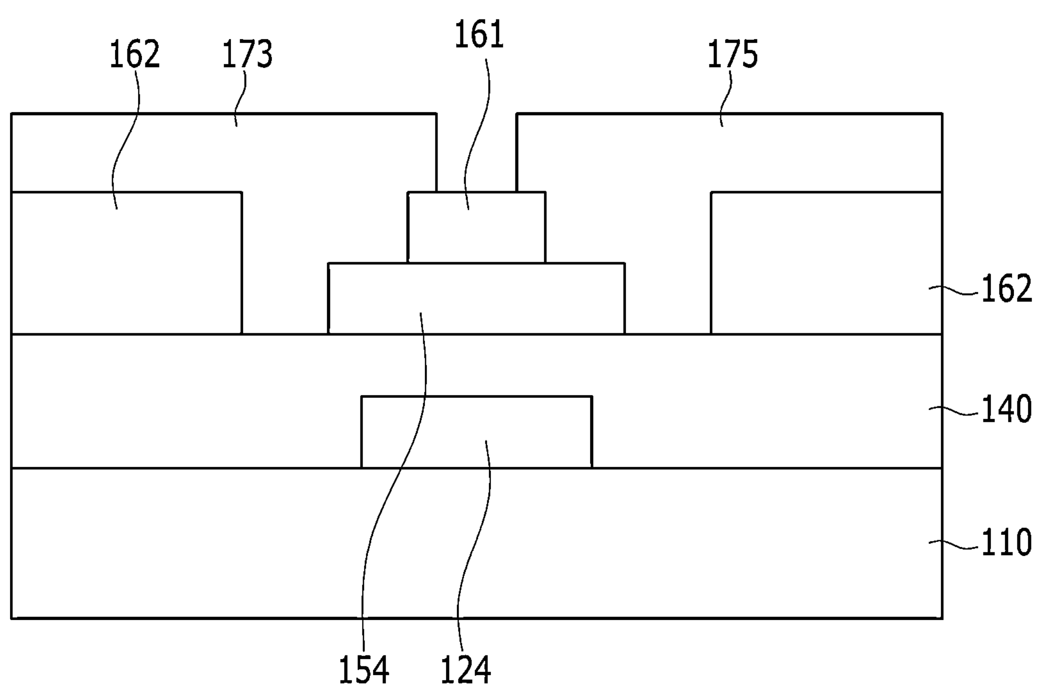
FIG. 1 is a cross-sectional view showing a thin film transistor according to one example embodiment.

The present disclosure will be described more fully hereinafter with reference to the accompanying drawings, in which example embodiments of this disclosure are shown. However, this disclosure may be embodied in many different forms and should not be construed as limited to the example embodiments set forth herein.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a thin film transistor according to one example embodiment is discussed in further detail with reference to the drawings.

FIG. 1 is a cross-sectional view showing a thin film transistor according to one example embodiment.

Referring to FIG. 1, a gate electrode 124 is formed on a substrate 110.

The substrate 110 may be made of, for example, transparent glass, silicon, or a polymer. The gate electrode 124 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

A gate insulating layer 140 is formed on the gate electrode 124.

The gate insulating layer 140 may be made of an organic material or an inorganic material. Examples of the organic material may include a polyvinyl alcohol-based compound, a polyimide-based compound, a polyacryl-based compound, a polystyrene-based compound, and a dissoluble polymer compound such as benzocyclobutane (BCB). Examples of the inorganic material may include a silicon nitride ($SiN_x$) and a silicon oxide ($SiO_x$).

An organic semiconductor 154 is formed on the gate insulating layer 140. The organic semiconductor 154 may be disposed at a position overlapping with the gate electrode 124 in the center of the gate insulating layer 140, and may have a shape of, for example, an island.

The organic semiconductor 154 may be made of a low molecular weight compound or polymer. The low molecular weight compound or polymer may be an aromatic compound (e.g., polycyclic aromatic compound). In a non-limiting embodiment, the low molecular weight compound or polymer may include at least one selected from pentacene and a derivative thereof, tetrabenzoporphyrin and a derivative thereof, polyphenylenevinylene and a derivative thereof, polyfluorene and a derivative thereof, polythienylenevinylene and a derivative thereof, polythiophene and a derivative thereof, polythienothiophene and a derivative thereof, polyarylamine and a derivative thereof, phthalocyanine and a derivative thereof, metallized phthalocyanine and a halogenated derivative thereof, perylenetetracarboxylic dianhydride (PTCDA), naphthalenetetracarboxylic dianhydride (NTCDA) and an imide derivative thereof, perylene and a derivative thereof, coronene and a derivative thereof, and heteroacene and a derivative thereof.

The organic semiconductor 154 may be formed by a deposition process, and the deposition-type organic semiconductor material may be a low molecular weight organic semiconductor material, for example, pentacene or a pentacene derivative, tetrabenzoporphyrin or a tetrabenzoporphyrin derivative, phthalocyanine or a phthalocyanine derivative, perylene or a perylene derivative, coronene or a coronene derivative, or heteroacene or a heteroacene derivative.

A solvent selective photosensitive pattern 161 and a solvent selective insulation layer 162 may be formed on the organic semiconductor 154. The term "solvent selective" refers to an ability to discriminately engage in a chemical interaction with a predetermined solvent, for example, dissolving, while substantially not causing a chemical interaction with the material for an organic semiconductor 154. The phrase "substantially not causing a chemical interaction" or "substantially non-reactive" refers to not affecting the arrangement, chemical characteristics, and electrical characteristics of an organic semiconductor material used for the organic semiconductor 154. The solvent selective photosensitive pattern 161 also serves an etch stop layer which protects the organic semiconductor 154 from damage.

The solvent selective photosensitive pattern 161 and the solvent selective insulation layer 162 may be formed from a composition substantially not causing the chemical interaction with the material for an organic semiconductor 154. The composition may include a fluorine compound, a photosensitive material, and a fluorine-containing solvent. The fluorine compound is the main component of the composition and may include a fluorine-containing low molecular weight compound, a fluorine-containing oligomer, a fluorine-containing polymer, or a combination thereof. The fluorine compound neither reacts with nor damages the organic semiconductor 154. The amount of the fluorine compound in the composition may be more than the amount of the photosensitive material but less than the amount of the fluorine-containing solvent. The fluorine compound may be present in the composition in an amount ranging from about 5 to 15 wt %, although example embodiments are not limited thereto. The photosensitive material may be, for example, a photoacid generator that is a material having reactivity with light. The photosensitive material may be present in the composition in an amount of about 5 wt % or less, although example embodiments are not limited thereto. As a solvent, a fluorine-containing solvent is used instead of a general organic solvent such as propylene glycol methyl ether acetate (PGMEA). The fluorine-containing solvent can dissolve the fluorine compound without reacting with or damaging the organic semiconductor 154. The fluorine-containing solvent may be present in the composition in an amount ranging from about 80 to 90 wt %, although example embodiments are not limited thereto.

Figure 9:
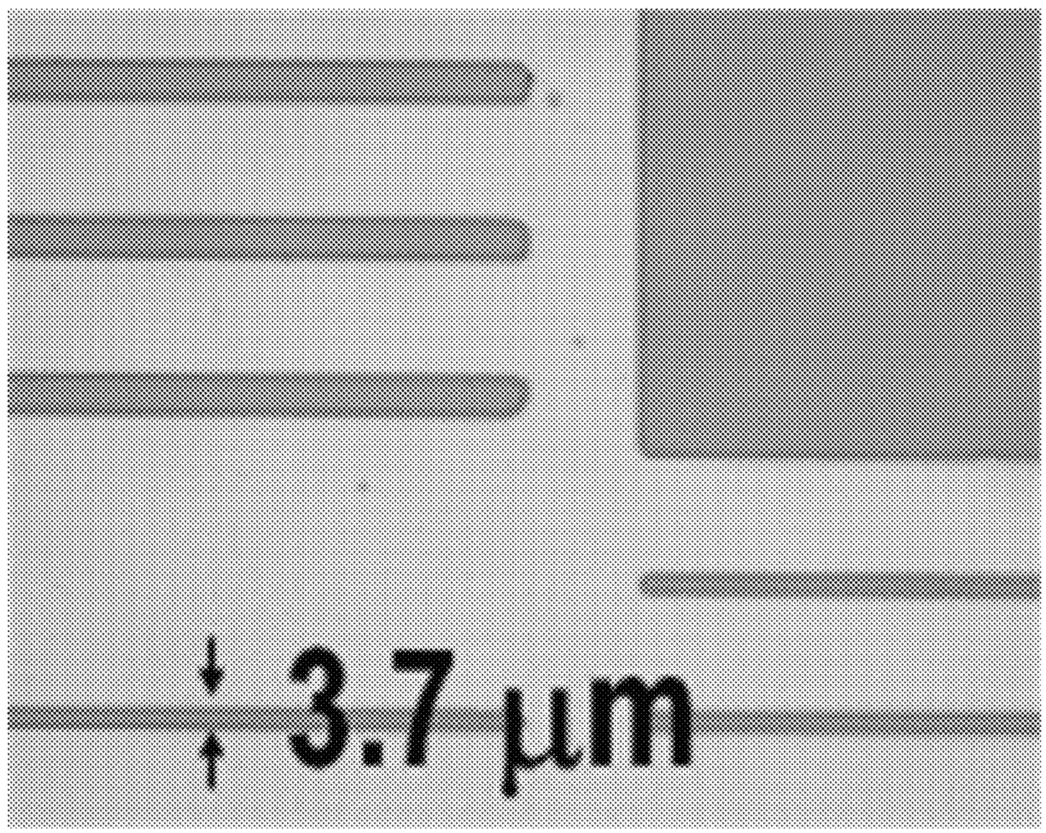
FIG. 9 is a photograph showing a pattern having a fine line-width without damage according to one example embodiment.

The solvent selective photosensitive pattern 161 may have a smaller width than that of the organic semiconductor 154, and the solvent selective photosensitive pattern 161 may have a width that is substantially the same as the channel length of the thin film transistor. Thereby, the width of solvent selective photosensitive pattern 161 may be adjusted according to the desirable channel length, and a short channel length, for example, less than or equal to about 10 μm, may be accomplished by adjusting the width of solvent selective photosensitive pattern 161. As an example, referring to FIG. 9, it has been confirmed that a pattern can be formed from the composition so as to have a relatively fine line-width of less than 5 μm, without damage.

The solvent selective photosensitive pattern 161 may not affect the chemical characteristics and the electric characteristics of the organic semiconductor 154 and may prevent damage to the channel region of the organic semiconductor 154 from plasma and/or a chemical solution such as an etching solution, a developing solution, and a stripping solution during subsequent processes.

The solvent selective insulation layer 162 may be formed on the gate insulating layer 140, with the exception of the region where the organic semiconductor 154 is provided.

A source electrode 173 and a drain electrode 175 are formed on the solvent selective photosensitive pattern 161 and the solvent selective insulation layer 162. The source electrode 173 is connected to a data line (not shown) transferring a data signal. The source electrode 173 and drain electrode 175 may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The source electrode 173 and the drain electrode 175 are on the organic semiconductor 154 and face each other across the solvent selective photosensitive pattern 161 therebetween. The source electrode 173 and the drain electrode 175 are also electrically connected to the organic semiconductor 154. The electrically connecting the source electrode 173 and the drain electrode 175 to the organic semiconductor 154 refers to including a structure that directly connects the source electrode 173 and the drain electrode 175 to the organic semiconductor 154, and including a structure interposing a semi-conductive or conductive material therebetween.

As described above, the thin film transistor according to one example embodiment has a top contact structure in which the organic semiconductor 154 and source electrode 173 (and the organic semiconductor 154 and drain electrode 175) are electrically connected above the organic semiconductor 154. The top contact structure may provide a stable channel of the organic semiconductor 154 by ensuring the continuity of the organic semiconductor 154 compared to a bottom contact in which the source electrode 173 (and drain electrode 175) are electrically connected to organic semiconductor 154 from the bottom side of the organic semiconductor 154. In addition, the source electrode 173 and the drain electrode 175 are obtained by a process such as deposition and patterning and the like, and then the electrode materials for the source electrode 173 and the drain electrode 175 are directly deposited on the organic semiconductor layer under vacuum to decrease contact resistance between the organic semiconductor 154 and source electrode 173 and between the organic semiconductor 154 and drain electrode 175.

In addition, the thin film transistor according to one example embodiment may not affect the chemical characteristics and the electric characteristics of the organic semiconductor 154 and may prevent damage to the channel region of the organic semiconductor 154 during subsequent processes, by forming the solvent selective photosensitive pattern 161 made of the material substantially not causing a chemical interaction with the organic semiconductor 154 at the place corresponding to the channel region of the organic semiconductor 154. In addition, the channel length of thin film transistor may be controlled by adjusting the width of the solvent selective photosensitive pattern 161, so that a short channel length may be accomplished at less than or equal to about 10 μm, for example, less than or equal to about 5 μm. Thus the performance of thin film transistor including the organic semiconductor 154 may be improved.

The thin film transistor may be applied to various electronic devices such as a semiconductor device, a flat panel display, an energy device, and a sensor. The electronic device may include, for example, a liquid crystal display (LCD), an organic light emitting device, a solar cell, and an organic sensor.

Hereinafter, a method of manufacturing a thin film transistor according to the non-limiting embodiment of FIG. 1 will be described with reference to FIGS. 2 to 8 along with FIG. 1.

FIGS. 2 to 8 are cross-sectional views sequentially showing a method of manufacturing the thin film transistor of FIG. 1.

Figure 2:
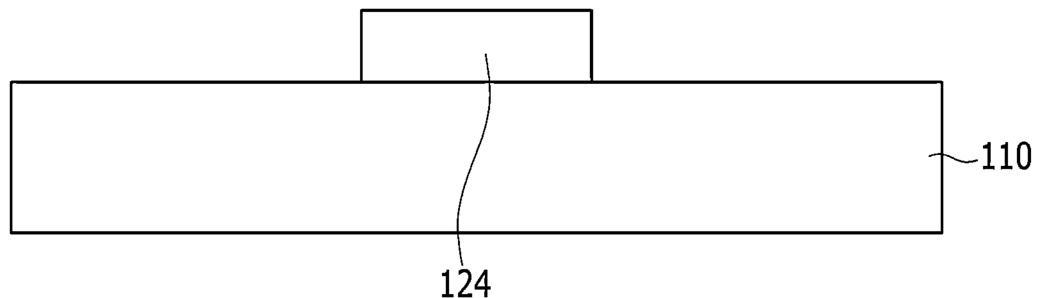
FIGS. 2 to 8 are cross-sectional views sequentially showing a method of manufacturing the thin film transistor in FIG. 1 according to one example embodiment.

Referring to FIG. 2, the gate electrode 124 is formed by forming a conductive metal electrode layer on the substrate 110 through sputtering and performing photolithography on the conductive metal electrode layer.

Figure 3:
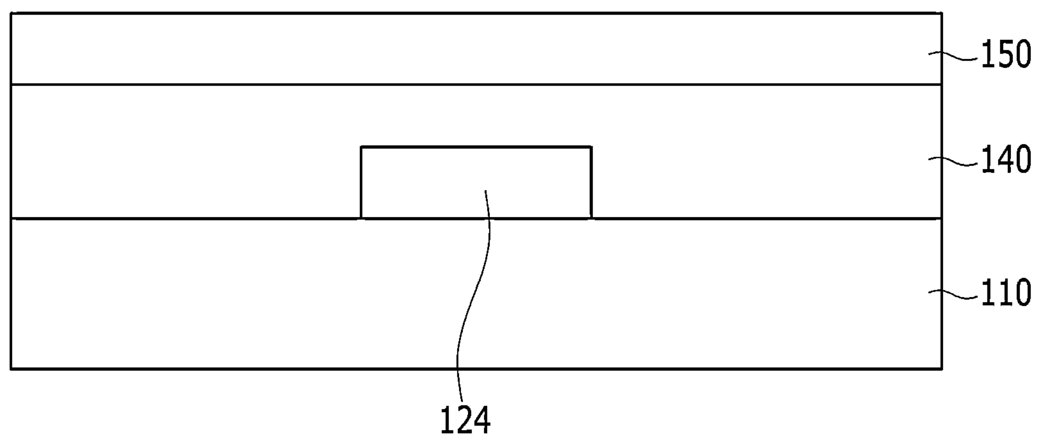

Referring to FIG. 3, the gate insulating layer 140 is formed on the gate electrode 124. The gate insulating layer 140 may be formed, for example, in a dry process such as chemical vapor deposition, or in a solution process such as spin coating, inkjet printing, and the like.

Subsequently, an organic semiconductor thin film 150 is formed on the gate insulating layer 140. The organic semiconductor thin film 150 may be obtained by, for example, a dry process such as vacuum deposition, or by a solution process such as spin coating, inkjet printing, and the like.

Figure 4:
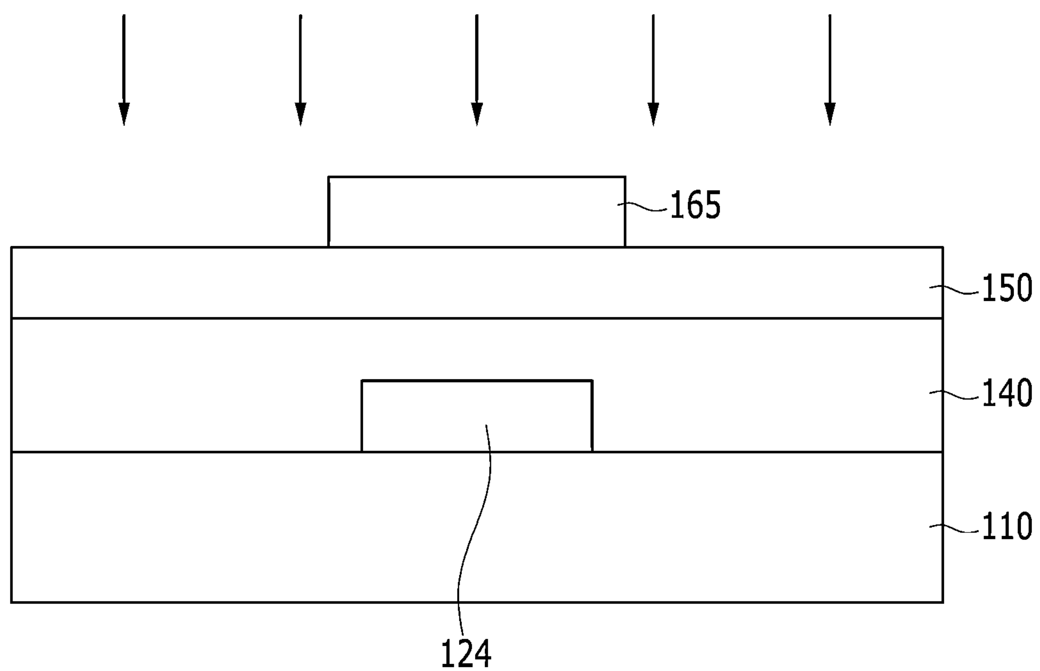

Referring to FIG. 4, a photosensitive layer for a mask (not shown) is coated on the organic semiconductor thin film 150 and patterned to provide a mask pattern 165. The mask pattern 165 may be made of, for example, a composition substantially not causing a chemical interaction with the organic semiconductor thin film 150, and the composition may include, for example, a fluorine compound (including fluorine-containing low molecules, a fluorine-containing oligomer, a fluorine-containing polymer, or a combination thereof), a photosensitive material, and a fluorine-containing solvent. The composition may be the same as the composition used when forming the later-described solvent selective photosensitive pattern 161.

Figure 5:
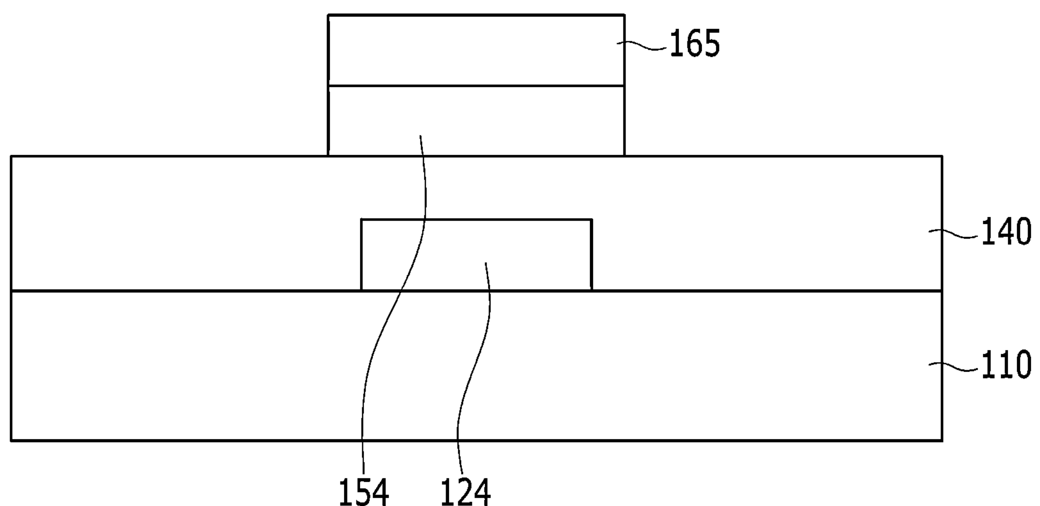

Referring to FIG. 4 and FIG. 5, using the mask pattern 165 as a mask, the organic semiconductor thin film 150 is etched to provide the organic semiconductor 154. The etching may be performed by, for example, dry-etching such as reactive ion etching (RIE) using oxygen plasma.

Figure 6:
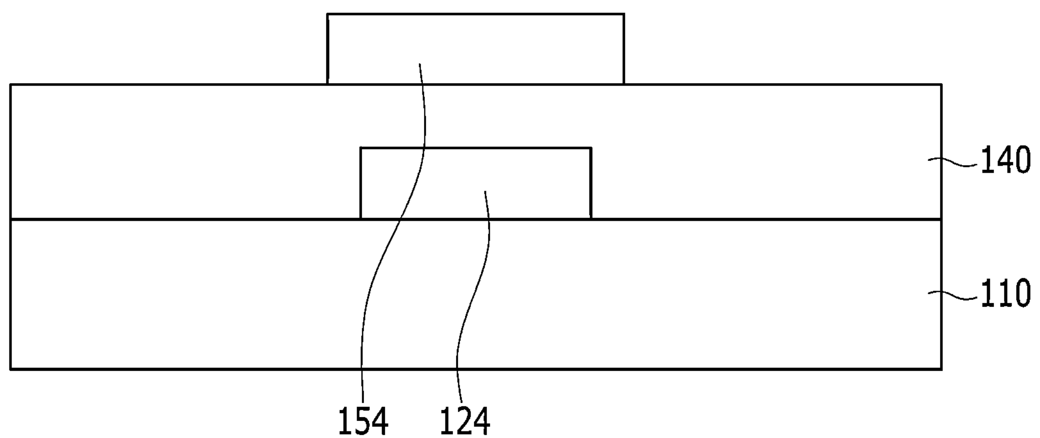

Referring to FIG. 6, the patterning of the organic semiconductor layer is completed by removing the mask pattern 165.

Figure 7:
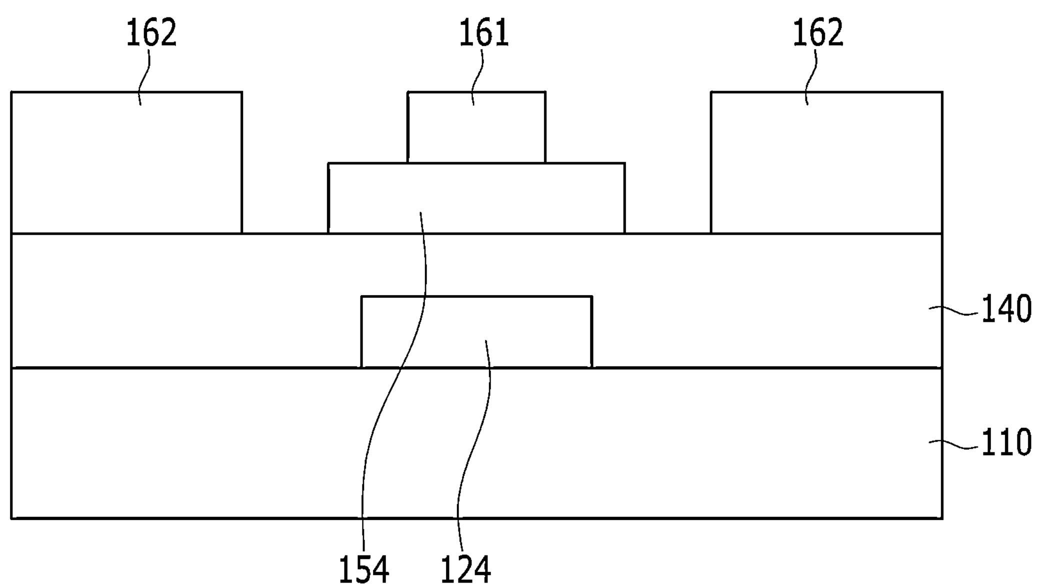

Referring to FIG. 7, a composition having solution selectivity is coated on the organic semiconductor 154 and the gate insulating layer 140 and patterned to provide the solvent selective photosensitive pattern 161 and the solvent selective insulation layer 162. The composition may include, for example, a composition substantially not causing a chemical reaction with the organic semiconductor 154, and may include, for example, a fluorine compound (including fluorine-containing low molecular weight molecules, a fluorine-containing oligomer, a fluorine-containing polymer, or a combination thereof), a photosensitive material, and a fluorine-containing solvent. The composition may be coated by a solution process, for example, spin coating, slit coating, or inkjet printing.

The providing of the solvent selective photosensitive pattern 161 and the solvent selective insulation layer 162 may be performed at less than or equal to about 150° C., for example, at about 25° C. to about 150° C. By performing the process at a relatively low temperature, deterioration of the organic semiconductor 154 below the solvent selective photosensitive pattern 161 may be reduced or prevented. The solvent selective photosensitive pattern 161 may include at least 1 wt % fluorine in view of the composition used in its formation.

Figure 8:
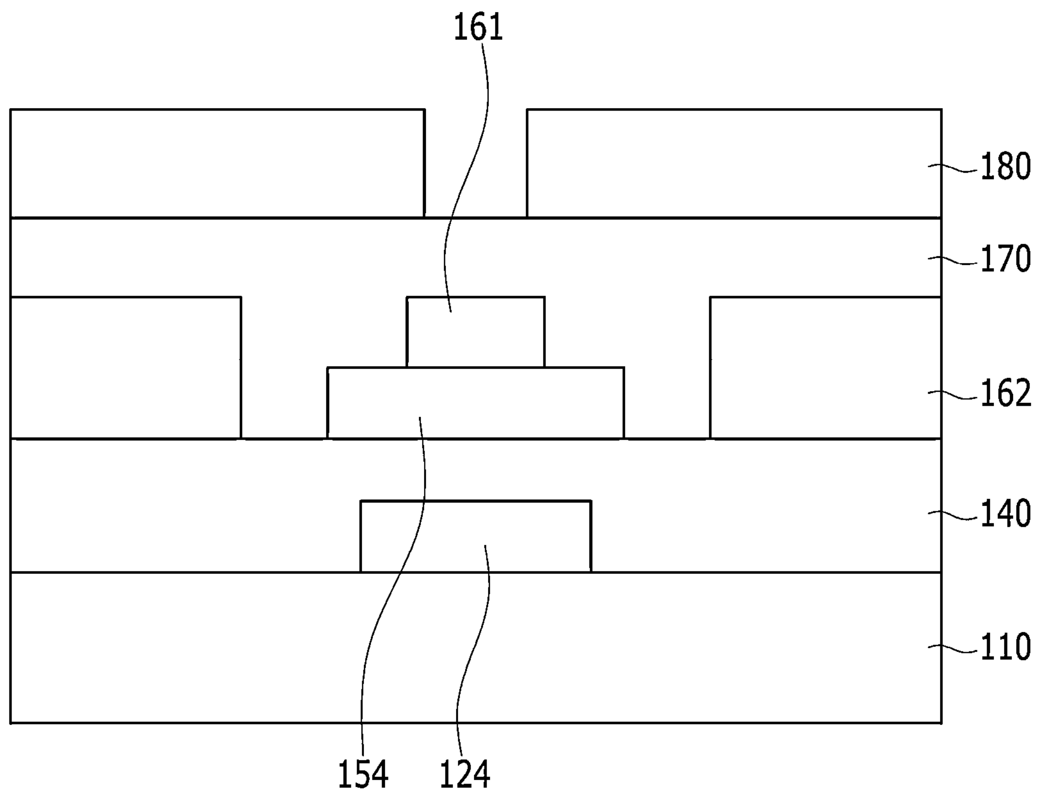

As shown in FIG. 8, a conductive metal electrode layer 170 is laminated through sputtering on the solvent selective photosensitive pattern 161 and the solvent selective insulation layer 162, and then a photosensitive layer (not shown) is coated thereon. Subsequently, the photosensitive layer is patterned to form a photosensitive pattern 180.

Then, referring to FIG. 1, using the photosensitive pattern 180 as a mask, the conductive metal electrode layer 170 is processed through photolithography to provide the source electrode 173 and the drain electrode 175 and then the photosensitive pattern 180 is removed.

Hereinafter, the present disclosure is described in more detail with reference to various examples. However, it should be understood that the following are merely examples, and the present disclosure is not limited thereto.

Manufacture of Thin Film Transistor

Example 1

Molybdenum is deposited on a glass substrate through sputtering and processed through photolithography to provide a gate electrode. Subsequently, a silicon oxide is deposited through plasma enhanced chemical vapor deposition (PECVD) to provide a gate insulating layer. A self-assembled layer is then formed on the surface of the gate insulating layer using octadecyl trichlorosilane. Then, a heteroacene-based organic semiconductor represented by the Chemical Formula A is vacuum deposited to provide an organic semiconductor thin film. A composition (AZ Electronic Materials USA Co.) including 5-15 wt % of a fluorine compound, less than or equal to 5 wt % of a photoacid generator, and 80-90 wt % of a fluorine-containing solvent is then coated to provide a photosensitive layer and processed through photolithography. Subsequently, the organic semiconductor thin film is etched by oxygen plasma with a mask of the patterned photosensitive layer to provide an organic semiconductor. The patterned photosensitive layer is then removed. Then, a composition (AZ Electronic Materials USA Co.) including 5-15 wt % of a fluorine compound, less than or equal to 5 wt % of a photoacid generator, and 80-90 wt % of a fluorine-containing solvent is coated on the gate insulating layer and the organic semiconductor and patterned to provide a solvent selective photosensitive pattern disposed on the organic semiconductor and a solvent selective insulation layer disposed on the gate insulating layer. Gold (Au) is then deposited through thermal evaporation and processed through photolithography to provide a source electrode and a drain electrode, thereby obtaining a thin film transistor.

[Chemical Formula A]

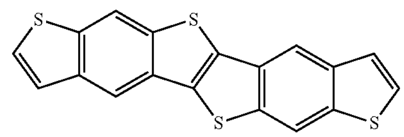

Comparative Example 1

Molybdenum is deposited on a glass substrate according to sputtering and performed with photolithography to provide a gate electrode. Subsequently, a silicon oxide is deposited through chemical vapor deposition (PECVD) to provide a gate insulating layer. Next, a self-assembled layer is formed on the surface of gate insulating layer using octadecyl trichlorosilane. A heteroacene-based organic semiconductor represented by the Chemical Formula A is then vacuum deposited to provide an organic semiconductor thin film. A photoacryl-based photosensitive agent (TR-8887 SA7, DONGJIN SEMICHEM CO., LTD.) is then coated and processed through photolithography. Subsequently, the organic semiconductor thin film is etched by oxygen plasma with a mask of the patterned photosensitive layer to provide an organic semiconductor. Then, the patterned photosensitive layer is removed with a stripping agent (Clariant AZ 300 MIF Developer). Gold (Au) is then deposited through thermal evaporation and processed through photolithography to provide a source electrode and a drain electrode, thereby obtaining a thin film transistor.

Reference Example 1

Molybdenum is deposited on a glass substrate through sputtering and processed through photolithography to provide a gate electrode. Next, a silicon oxide is deposited through chemical vapor deposition (PECVD) to provide a gate insulating layer. Subsequently, a self-assembled layer is formed on the surface of gate insulating layer using octadecyl trichlorosilane. A heteroacene-based organic semiconductor represented by the Chemical Formula A is then vacuum deposited to provide an organic semiconductor thin film. A substrate deposited with the organic semiconductor is matched with a shadow mask and gold is deposited through thermal evaporation to provide a source electrode and a drain electrode, thereby obtaining a thin film transistor.

Evaluation

Evaluation 1

Characteristics of the thin film transistors according to Example 1 and Comparative Example 1 are evaluated.

Figure 10:
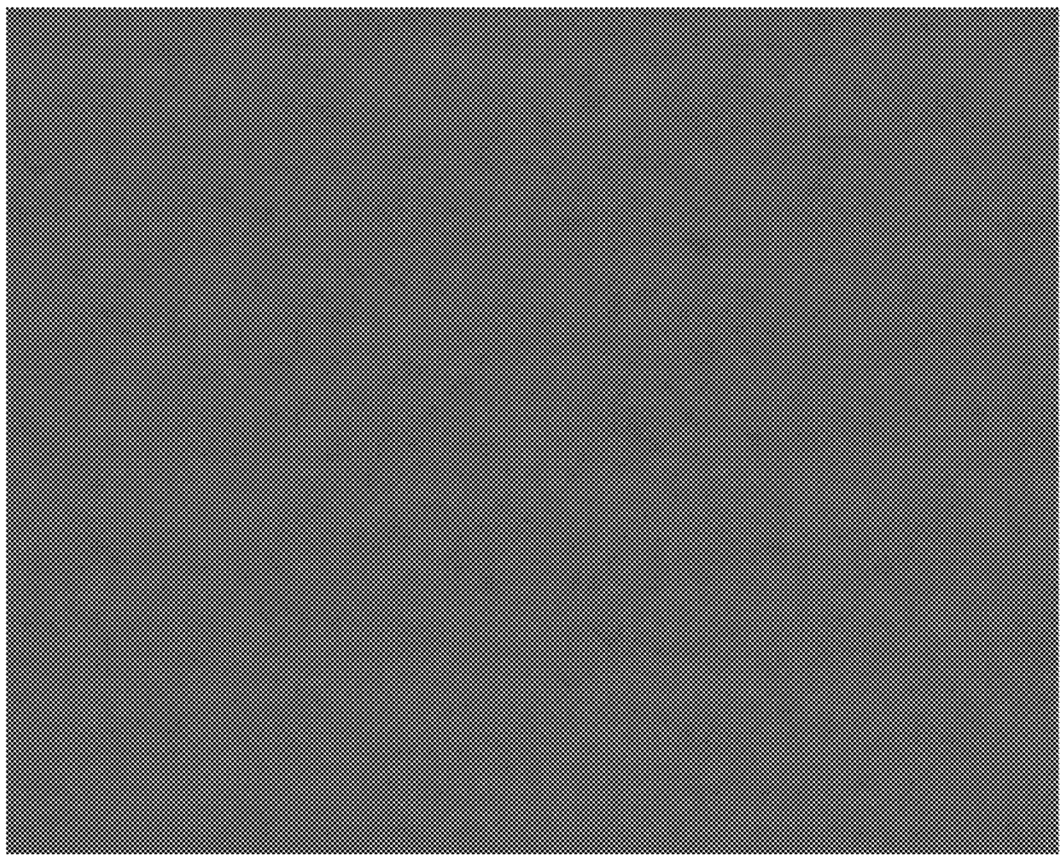
FIG. 10 is a photograph showing the surface of the organic semiconductor of thin film transistor according to Example 1.
Figure 11:
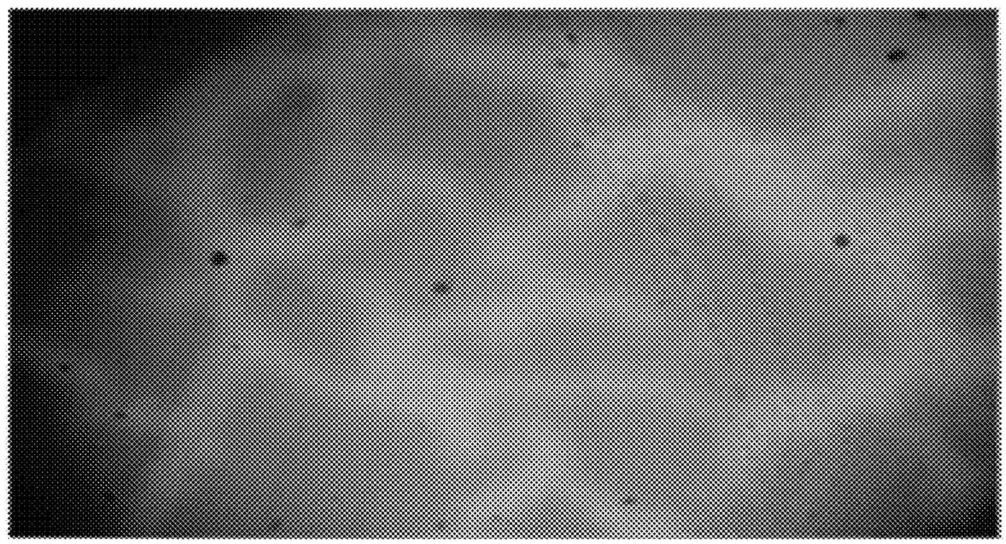
FIG. 11 is a photograph showing the surface of the organic semiconductor of thin film transistor according to Comparative Example 1.

FIG. 10 is a photograph showing the surface of the organic semiconductor of the thin film transistor according to Example 1. FIG. 11 is a photograph showing the surface of the organic semiconductor of the thin film transistor according to Comparative Example 1.

Referring to FIG. 10, it is confirmed that physical damage is not found in the organic semiconductor of the thin film transistor according to Example 1. On the other hand, referring to FIG. 11, the surface of the organic semiconductor of the thin film transistor according to Comparative Example 1 is cracked.

Evaluation 2

Characteristics of the thin film transistors according to Example 1 and Reference Example 1 are evaluated.

Table 1 shows charge mobility and high temperature reliability of the thin film transistors according to Example 1 and Reference Example 1. The high temperature reliability is measured by a change of threshold voltage after driving the same at about 60° C. for 10,000 seconds.

The results are shown in Table 1.

TABLE 1

| | Charge mobility ($cm^2/V \cdot s$) | Reliability (ΔVth) |
|---|---|---|
| Example 1 | 9.3 | <\|2 V\| |
| Reference Example 1 | 9.5 | <\|2 V\| |

As shown in Table 1, it is confirmed that the thin film transistor according to Example 1 has a charge mobility and high temperature reliability of equivalent levels to those of Reference Example 1.

While various example embodiments are discussed herein, it is to be understood that the present disclosure is not limited to the disclosed embodiments, but, on the contrary, is intended to cover various modifications and equivalent arrangements included within the spirit and scope of the appended claims.

What is claimed is:

1. A thin film transistor comprising:

a gate electrode;

an organic semiconductor overlapping the gate electrode;

a gate insulating layer between the gate electrode and the organic semiconductor;

a source electrode and a drain electrode disposed on and electrically connected to the organic semiconductor;

a solvent selective photosensitive pattern on the organic semiconductor and between the source electrode and the drain electrode, the source electrode and the drain electrode overlapping a top surface of opposing edges of the solvent selective photosensitive pattern, the solvent selective photosensitive pattern formed from a composition including a fluorine compound, a photosensitive material, and a fluorine-containing solvent, the fluorine compound including a fluorine-containing low molecular weight compound, a fluorine-containing oligomer, a fluorine-containing polymer, or a combination thereof, the solvent selective photosensitive pattern configured as an etch stop layer which protects the organic semiconductor from damage; and a channel having a length that is less than or equal to about 5 μm.

2. The thin film transistor of claim 1, wherein the solvent selective photosensitive pattern has a smaller width than the organic semiconductor.

3. The thin film transistor of claim 1, wherein a width of the solvent selective photosensitive pattern and the length of the channel of the thin film transistor are substantially the same.

4. The thin film transistor of claim 1, wherein the organic semiconductor is a deposited organic semiconductor.

5. An electronic device comprising the thin film transistor according to claim 1.

6. The electronic device of claim 5, wherein the electronic device is a liquid crystal display (LCD), an organic light emitting diode (OLED) display, an electrophoretic display, or an organic sensor.

7. A method of manufacturing a thin film transistor, comprising:

providing a gate electrode;

providing a gate insulating layer on the gate electrode;

providing an organic semiconductor on the gate insulating layer;

providing a solvent selective photosensitive pattern on the organic semiconductor, the solvent selective photosensitive pattern formed from a composition including a fluorine compound, a photosensitive material, and a fluorine-containing solvent, the fluorine compound including a fluorine-containing low molecular weight compound, a fluorine-containing oligomer, a fluorine-containing polymer, or a combination thereof, the solvent selective photosensitive pattern configured as an etch stop layer which protects the organic semiconductor from damage;

providing a source electrode and a drain electrode on the solvent selective photosensitive pattern and electrically connected to the organic semiconductor, the source electrode and the drain electrode overlapping a top surface of opposing edges of the solvent selective photosensitive pattern; and providing a channel having a length that is less than or equal to about 5 μm.

8. The method of claim 7, wherein the providing an organic semiconductor comprises:

providing an organic semiconductor thin film on the gate insulating layer; and etching the organic semiconductor thin film using a mask pattern formed of a same material as the solvent selective photosensitive pattern.

9. The method of claim 8, wherein the providing an organic semiconductor thin film is performed through solution coating or deposition, and the etching the organic semiconductor thin film is performed through dry etching.

10. A thin film transistor comprising:

a gate insulating layer on a gate electrode;

an organic semiconductor on the gate insulating layer;

a solvent selective photosensitive pattern on the organic semiconductor, the solvent selective photosensitive pattern formed from a composition including a fluorine compound, a photosensitive material, and a fluorine-containing solvent, the fluorine compound including a fluorine-containing low molecular weight compound, a fluorine-containing oligomer, a fluorine-containing polymer, or a combination thereof, the solvent selective photosensitive pattern configured as an etch stop layer which protects the organic semiconductor from damage;

a source electrode and a drain electrode overlapping a top surface of opposing edges of the solvent selective photosensitive pattern and the organic semiconductor; and a channel having a length that is less than or equal to about 5 μm.

11. The thin film transistor of claim 10, wherein a width of the organic semiconductor is greater than a width of the gate electrode.

12. The thin film transistor of claim 10, wherein a width of the solvent selective photosensitive pattern is less than a width of the organic semiconductor.

13. The thin film transistor of claim 10, wherein a width of the solvent selective photosensitive pattern is less than or equal to about 10 μm.

14. The thin film transistor of claim 1, wherein the fluorine compound is present in the composition in an amount ranging from about 5 to 15 wt %.

15. The thin film transistor of claim 1, wherein the photosensitive material is present in the composition in an amount of about 5 wt % or less.

16. The thin film transistor of claim 1, wherein the fluorine-containing solvent is present in the composition in an amount ranging from about 80 to 90 wt %.

* * * * *